US012597896B2

(12) United States Patent
Petroianu et al.

(10) Patent No.: US 12,597,896 B2
(45) Date of Patent: Apr. 7, 2026

(54) SLEW-RATE BOOST CIRCUITRY

(71) Applicant: SEMICONDUCTOR COMPONENTS INDUSTRIES, LLC, Phoenix, AZ (US)

(72) Inventors: Catalin Ionut Petroianu, Bucharest (RO); Alexandra-Oana Petroianu, Bucharest (RO)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 803 days.

(21) Appl. No.: 17/931,947

(22) Filed: Sep. 14, 2022

(65) Prior Publication Data

US 2024/0088853 A1 Mar. 14, 2024

(51) Int. Cl.
H03F 3/45 (2006.01)
(52) U.S. Cl.
CPC ..... H03F 3/45273 (2013.01); H03F 3/45475 (2013.01); H03F 2203/45248 (2013.01)
(58) Field of Classification Search
CPC ............. H03F 3/45273; H03F 3/45475; H03F 2203/45248; H03F 3/3022; H03F 2203/45392; H03F 1/0205; H03F 3/45183; H03F 3/4521; H03F 1/0211; H03F 1/26; H03F 1/32; H03F 3/45
USPC ........................................................ 330/253
See application file for complete search history.

(56) References Cited

U.S. PATENT DOCUMENTS

| | | | | |
|---|---|---|---|---|
| 5,317,281 | A | 5/1994 | Mnn et al. | |
| 7,362,173 | B1 * | 4/2008 | Knausz | H03F 3/4521 |
| | | | | 330/253 |
| 2002/0109547 | A1 | 8/2002 | Ivanov et al. | |
| 2005/0285676 | A1 * | 12/2005 | Jones | H03F 3/3022 |
| | | | | 330/255 |

OTHER PUBLICATIONS

Extended European Search Report for counterpart EP application No. 23191905.1, dated Mar. 7, 2024, 9 pages.
Vadim Ivanov et al., "250 MHz CMOS Rail-to-Rail IO OpAmp; Structural Design Approach," IEEE Xplore, 2022.

* cited by examiner

*Primary Examiner* — Andrea Lindgren Baltzell
*Assistant Examiner* — Jose E Pinero
(74) *Attorney, Agent, or Firm* — Brake Hughes Bellermann LLP

(57) ABSTRACT

The techniques described herein relate to a circuit including an operational amplifier that includes a differential amplifier, a capacitor, and an output stage. The differential amplifier includes a first input and a second input. The output stage is configured to generate an output voltage. The circuit includes a slew-rate boost circuitry connected to the operational amplifier. The slew-rate boost circuitry is configured to detect a voltage differential between the first input and the second input and apply, at an output of the differential amplifier, a boost current to charge the capacitor during a period of time in which the output voltage increases or decreases to a target voltage level.

20 Claims, 9 Drawing Sheets

100

900

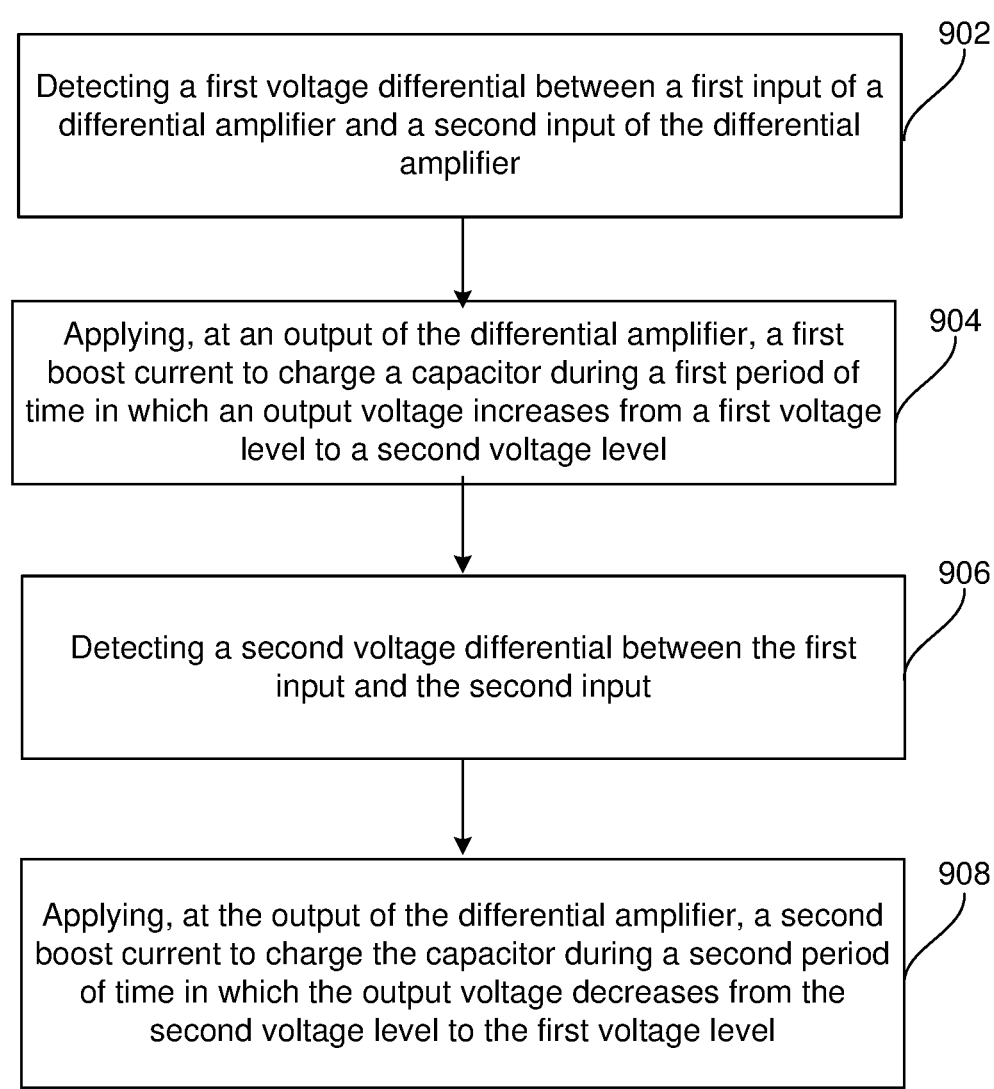

Detecting a first voltage differential between a first input of a differential amplifier and a second input of the differential amplifier

902

Applying, at an output of the differential amplifier, a first boost current to charge a capacitor during a first period of time in which an output voltage increases from a first voltage level to a second voltage level

904

Detecting a second voltage differential between the first input and the second input

906

Applying, at the output of the differential amplifier, a second boost current to charge the capacitor during a second period of time in which the output voltage decreases from the second voltage level to the first voltage level

SLEW-RATE BOOST CIRCUITRY

BACKGROUND

Slew-rate may be the measure of how fast an operational amplifier can charge the output capacitance. A high value for the slew-rate may increase the performance of the operational amplifier but can also increase power consumption and/or affect other performance parameters such as bandwidth and noise.

SUMMARY

In some examples, the techniques described herein relate to a circuit including an operational amplifier that includes a differential amplifier, a capacitor, and an output stage. The differential amplifier includes a first input and a second input. The output stage is configured to generate an output voltage. The circuit includes a slew-rate boost circuitry connected to the operational amplifier. The slew-rate boost circuitry is configured to detect a voltage differential between the first input and the second input and apply, at an output of the differential amplifier, a boost current to charge the capacitor during a period of time in which the output voltage increases or decreases to a target voltage level.

In some examples, the techniques described herein relate to a circuit including an operational amplifier that includes a differential amplifier, a capacitor, and an output stage. The output stage configured to generate an output voltage, a first control circuitry configured to apply, at an output of the differential amplifier, a first boost current to charge the capacitor during a first period of time in which the output voltage increases from a first voltage level to a second voltage level, and a second control circuitry configured to apply, at the output of the differential amplifier, a second boost current to charge the capacitor during a second period of time in which the output voltage decreases from the second voltage level to the first voltage level.

In some examples, the techniques described herein relate to a method for increasing a slew-rate of an operational amplifier, the method including detecting a first voltage differential between a first input of a differential amplifier and a second input of the differential amplifier, applying, at an output of the differential amplifier, a first boost current to charge a capacitor during a first period of time in which an output voltage increases from a first voltage level to a second voltage level, detecting a second voltage differential between the first input and the second input, and applying, at the output of the differential amplifier, a second boost current to charge the capacitor during a second period of time in which the output voltage decreases from the second voltage level to the first voltage level.

BRIEF DESCRIPTION OF THE DRAWINGS

FIG. 9 illustrates a flowchart depicting example operations of an operational amplifier with a slew-rate boost circuitry according to an aspect.

DETAILED DESCRIPTION

Figure 1:
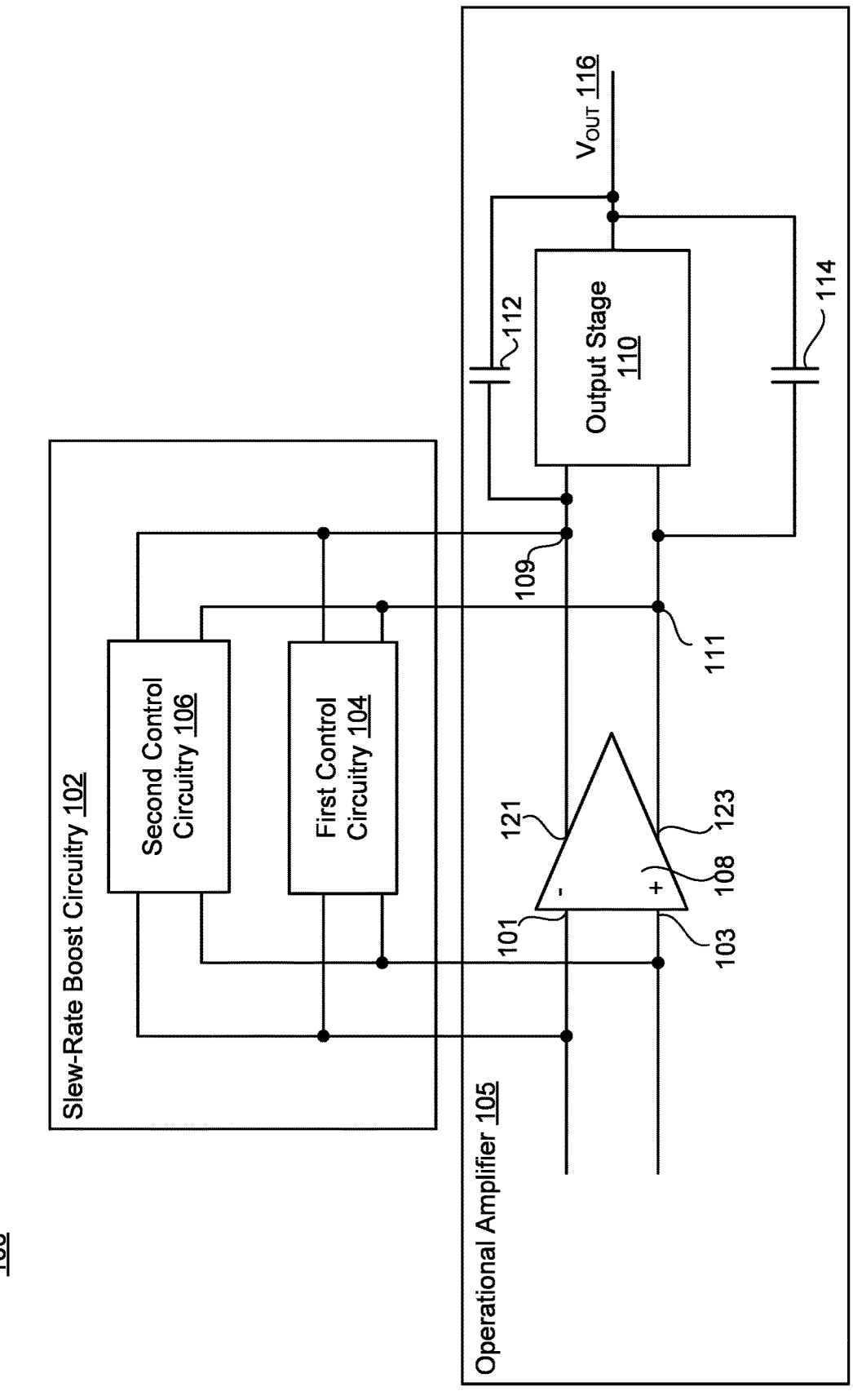
FIG. 1 illustrates a circuit having an operational amplifier and slew-rate boost circuitry according to an aspect.

This description relates to a slew-rate boost circuitry configured to increase a current applied to an operational amplifier during a slew condition, thereby reducing the amount of time to charge an output voltage of the operational amplifier to a target voltage level. For example, the slew-rate boost circuitry is configured to add a boost current to increase the slew-rate during the transient response of the operational amplifier. The operational amplifier may include a differential amplifier, an output stage coupled to an output of the differential amplifier, and one or more output capacitances coupled to the output of the differential amplifier or the output stage.

The slew-rate boost circuitry includes a first control circuitry and a second control circuitry. The first control circuitry is configured to apply a first boost current to increase a positive voltage slope (e.g., a rising edge slope), and the second control circuitry 106 is configured to apply a second boost current to increase a negative voltage slope (e.g., a falling edge slope). Since the slew-rate boost circuitry independently monitors and controls the positive voltage slope and the negative voltage slope (e.g., via the first control circuitry and the second control circuitry), the response time of the operational amplifier can be improved while minimizing the effect on other parameters such as noise and bandwidth.

In some examples, the first control circuitry is connected to the output of the differential amplifier. The first control circuitry is configured to apply, at the output of the differential amplifier, the first boost current to charge the output capacitance(s) during the slewing operation (e.g., during the period of time in which the output voltage increases from a first voltage level to a second voltage level). The first boost current may increase the positive voltage slope (e.g., the slew-rate) such that the output capacitance(s) are charged faster. When the output voltage reaches the second voltage level, the first control circuitry may remove the first boost current (e.g., provide a first boost current of zero or substantially zero). In other words, the first boost current may be applied during the transient response of the operational amplifier. Since the first boost current is applied during the transient response, the quiescent current may be minimized. For example, a slew-rate value may be proportional (e.g., directly proportional) to the quiescent current of a circuit that includes an operational amplifier. However, according to the techniques discussed herein, the slew-rate boost circuitry may increase the slew-rate while minimizing the quiescent current in the operational amplifier.

In some examples, the second control circuitry is connected to the output of the differential amplifier. The second control circuitry is configured to apply, at the output of the differential amplifier, the second boost current to charge the output capacitance(s) during the slewing operation (e.g., during the period of time in which the output voltage decreases from the second voltage level to the first voltage level). The second boost current may increase the negative voltage slope (e.g., the slew-rate) such that the output capacitance(s) are charged faster. When the output voltage reaches the first voltage level, the second control circuitry may remove the second boost current (e.g., provide a second boost current of zero or substantially zero). In other words, the second boost current may be applied during the transient response of the operational amplifier. Similar to the first boost current, since the second boost current is applied during the transient response, the quiescent current may be minimized in the operational amplifier.

FIG. 1 illustrates a circuit 100 for increasing the slew-rate of an operational amplifier 105 according to an aspect. The slew-rate may be the measure of how fast the operational amplifier 105 can charge output capacitances (e.g., capacitor 112, capacitor 114). The circuit 100 may apply a boost current to increase the rate at which the output capacitances are charged, where the boost current is applied when the operational amplifier 105 is active. The operational amplifier 105 may be active when the output voltage 116 is changing in response to a change to the input voltage. In other words, the operational amplifier 105 may be active during a transient response of the operational amplifier 105 (e.g., during a slewing operation). The circuit 100 may remove the boost current when the operational amplifier 105 is not active (e.g., in a steady-state mode). The operational amplifier 105 may be in a non-active state when an equilibrium between the input and the output is achieved (e.g., no further voltage movements). Because the circuit 100 may selectively apply the boost current during (e.g., only during) the transient response of the operational amplifier 105, the quiescent current (IQ) of the circuit 100 may be reduced, which can reduce power consumption. Furthermore, the boost current may be applied at an output of a differential amplifier 108 or an output stage 110 of the operational amplifier 105, which can reduce noise and/or distortion within the circuit 100.

The circuit 100 may be used in a wide variety of devices such as analog-to-digital converters (ADCs), digital-to-analog converters (DACs), buffers, or regulated power supplies. The operational amplifier 105 includes a differential amplifier 108, an output stage 110, a capacitor 112, and a capacitor 114.

The differential amplifier 108 includes a first input 101 and a second input 103. The differential amplifier 108 is configured to amplify the voltage difference between the first input 101 and the second input 103. In some examples, the first input 101 is an inverting input. In some examples, the second input 103 is a non-inverting input. A voltage differential between the first input 101 and the second input 103 may represent an input signal. The output stage 110 is connected to the differential amplifier 108. The output stage 110 is configured to generate the output voltage 116 (e.g., the output of the output stage 110 is the output voltage 116). The output stage 110 may include one or more electrical components such as transistor(s), amplifier(s), and/or voltage/current source(s). The topology of the output stage 110 may widely vary depending on the implementation of the circuit 100.

In some examples, the differential amplifier 108 includes a first output 121 and a second output 123. Similar to the first input 101 and the second input 103, the first output 121 and the second output 123 are differential. In some examples, the differential amplifier 108 is referred to as fully differential. In some examples, the first output 121 is a positive output. In some examples, the second output 123 is a negative output. The output voltages of the differential amplifier 108 may be equal but opposite in polarity. The first output 121 is connected to the input of the output stage 110. The second output 123 is connected to the input of the output stage 110.

The capacitor 112 and the capacitor 114 may be the output capacitances. The capacitor 112 and the capacitor 114 may represent compensation and/or parasitic capacitances. In some examples, the capacitor 112 is connected in parallel with the output stage 110. The capacitor 112 has a first terminal connected to the input of the output stage 110 and a second terminal connected to the output of the output stage 110. The first terminal of the capacitor 112 may be also connected to the first output 121. In some examples, the capacitor 114 is connected in parallel with the output stage 110. The capacitor 114 has a first terminal connected to the input of the output stage 110 and a second terminal connected to the output of the output stage 110. The first terminal of the capacitor 112 may be also connected to the second output 123.

The operational amplifier 105 may receive an input voltage and generate an output voltage 116 that corresponds to the input voltage. For example, if the input voltage changes from a threshold voltage (e.g., a first voltage level such as zero volts) to a higher voltage level (e.g., a second voltage level such as five volts), the operational amplifier 105 increases the output voltage 116 from the first voltage level to the second voltage level and the slew-rate is the time to change the output voltage 116 from the first voltage level to the second voltage level (e.g., rising edge slope). Similarly, if the input voltage changes from the second voltage level to the first voltage level, the operational amplifier 105 decreases the output voltage 116 from the second voltage level to the first voltage level and the slew-rate is the time to change the output voltage 116 from the second voltage level to the first voltage level (e.g., falling edge slope).

In further detail, if the voltage differential between the first input 101 and the second input 103 exceeds a first threshold level, the operational amplifier 105 converts the output voltage 116 from the first voltage level to the second voltage level (e.g., rising edge slope), which may be referred to as the transient response of the operational amplifier 105. Similarly, if the voltage differential between the first input 101 and the second input 103 exceeds a second threshold level, the operational amplifier 105 converts the output voltage 116 from the second voltage level to the first voltage level (e.g., falling edge slope), which may also be referred to as the transient response of the operational amplifier 105. In some examples, the second threshold level is the same as the first threshold level. In some examples, the second threshold level is different from the first threshold level.

The circuit 100 includes slew-rate boost circuitry 102 configured to add a boost current to increase the slew-rate during the transient response of the operational amplifier 105. In some examples, the design of the slew-rate boost circuitry 102 is relatively small, which occupies a relatively small space in a converter, thereby reducing or eliminating compensation capacitors. Also, the slew-rate boost circuitry 102 can be used for low voltage or high voltage operational amplifiers. Further, the slew-rate boost circuitry 102 may increase the slew-rate of the operational amplifier 105 without significantly increasing the overall quiescent current. The slew-rate boost circuitry 102 may be used with any type of operational amplifier topology.

The slew-rate boost circuitry 102 includes a first control circuitry 104 and a second control circuitry 106. The first control circuitry 104 is configured to apply a boost current to increase the positive voltage slope (e.g., rising edge slope), and the second control circuitry 106 is configured to apply a boost current to increase the negative voltage slope (e.g., falling edge slope). In some examples, the positive voltage slope may be a first slew-rate and the negative voltage slope may be a second slew-rate. Also, since the slew-rate boost circuitry 102 independently monitors and controls the positive and negative voltage slopes (e.g., via the first control circuitry 104 and the second control circuitry 106), the response time of the operational amplifier 105 can be improved while minimizing the effect on other parameters such as noise and bandwidth.

The first control circuitry 104 is connected to the first input 101 and the second input 103 of the differential amplifier 108. The first control circuitry 104 is configured to measure the voltage differential between the first input 101 and the second input 103 and detect a slewing condition, e.g., whether the voltage differential between the first input 101 and the second input 103 exceeds a threshold level. In some examples, the first control circuitry 104 detects whether the voltage differential is positive (e.g., increasing), and, in some examples, greater than a first voltage threshold. The first control circuitry 104 may be connected to the output of the differential amplifier 108. The first control circuitry 104 may be connected to the input of the output stage 110. In some examples, the first control circuitry 104 is connected to the first output 121 of the differential amplifier 108 and connected to the second output 123 of the differential amplifier 108. In some examples, the first control circuitry 104 is connected to a node 109, where the node 109 is connected to the first output 121 and the input of the output stage 110. In some examples, the first control circuitry 104 is connected to a node 111, where the node 111 is connected to the first output 121 and the input of the output stage 110.

The first control circuitry 104 is configured to apply, at the output of the differential amplifier 108, a boost current (e.g., a first boost current) to charge the output capacitances (e.g., the capacitor 112 and/or the capacitor 114) during the slewing operation (e.g., during the period of time in which the output voltage increases to the second voltage level). The boost current may increase the positive voltage slope (e.g., the slew-rate) such that the output capacitances are charged faster. When the output voltage 116 reaches the second voltage level, the first control circuitry 104 may remove the boost current. In other words, the boost current may be applied during the transient response of the operational amplifier 105.

The second control circuitry 106 is connected to the first input 101 and the second input 103 of the differential amplifier 108. The second control circuitry 106 is configured to measure the voltage differential between the first input 101 and the second input 103 and detect a slewing condition, e.g., whether the voltage differential between the first input 101 and the second input 103 exceeds a second voltage threshold. In some examples, the second control circuitry 106 is configured to detect whether the voltage differential is negative (e.g., decreasing) and, in some examples, greater than the second voltage threshold. The second control circuitry 106 may be connected to the output of the differential amplifier 108. The second control circuitry 106 may be connected to the input of the output stage 110. In some examples, the second control circuitry 106 is connected to the first output 121 of the differential amplifier 108 and connected to the second output 123 of the differential amplifier 108. In some examples, the second control circuitry 106 is connected to a node 109, where the node 109 is connected to the first output 121 and the input of the output stage 110. In some examples, the second control circuitry 106 is connected to a node 111, where the node 111 is connected to the first output 121 and the input of the output stage 110.

The second control circuitry 106 is configured to apply, at the output of the differential amplifier 108, a boost current (e.g., a second boost current) to charge the output capacitances (e.g., the capacitor 112 and/or the capacitor 114) during the slewing operation (e.g., during the period of time in which the output voltage decreases to the first voltage level). The boost current may increase the negative voltage slope such that the output capacitances are charged faster. When the output voltage 116 reaches the first voltage level, the second control circuitry 106 may remove the boost current. In other words, the boost current may be applied during the transient response of the operational amplifier 105.

Figure 2:
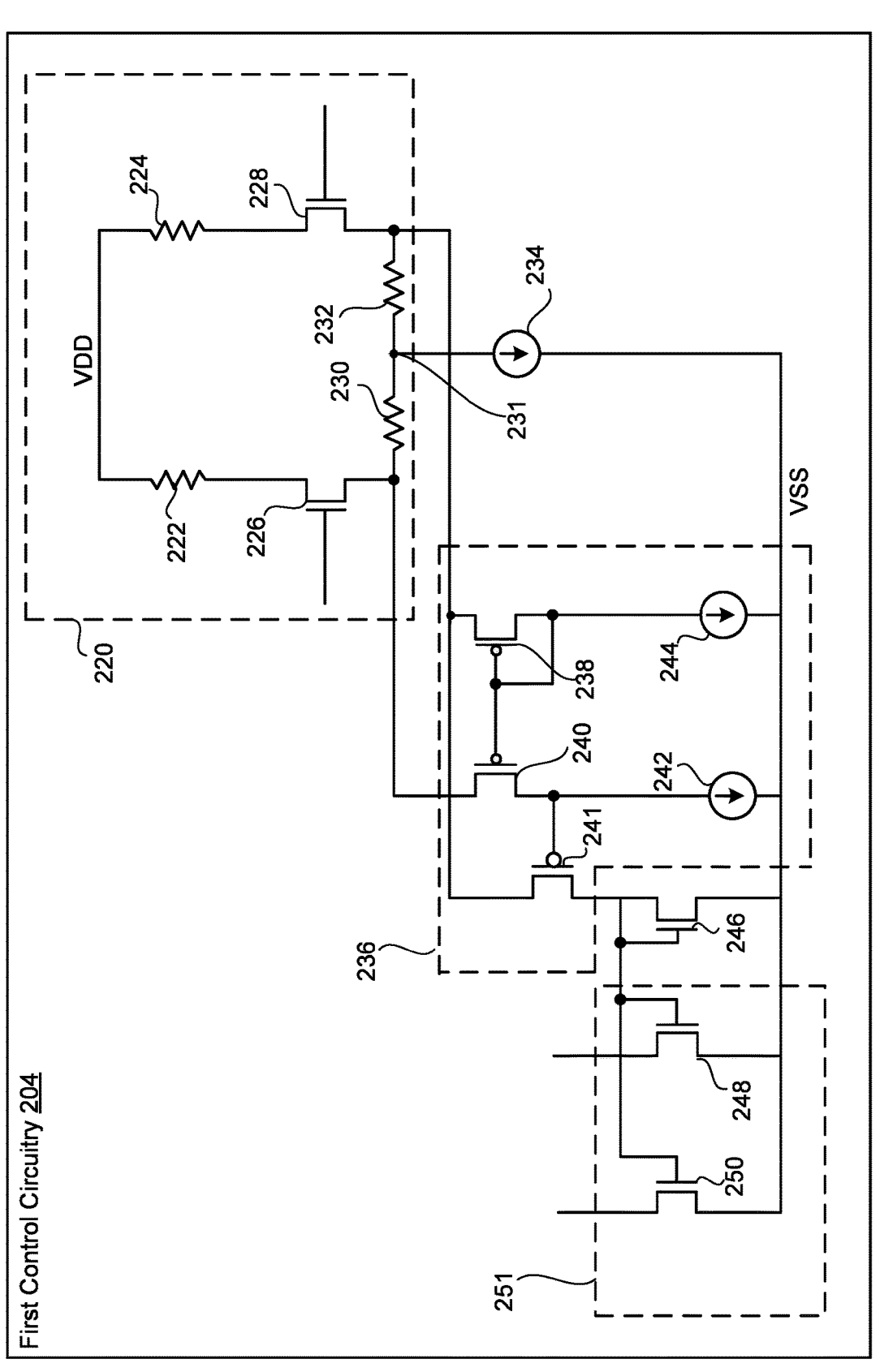
FIG. 2 illustrates a first control circuitry of the slew-rate boost circuitry according to an aspect.

FIG. 2 illustrates an example of a first control circuitry 204 according to an aspect. The first control circuitry 204 may be an example of the first control circuitry 104 of FIG. 1 and may include any of the details discussed with that figure.

The first control circuitry 204 includes a differential voltage detector 220, a sense amplifier 236, and a current mirror 251. The current mirror 251 is configured to generate the boost current, which is provided to the node 109 of FIG. 1 and the node 111 of FIG. 1.

The differential voltage detector 220 is configured to detect the voltage differential between the first input 101 of FIG. 1 and the second input 103 of FIG. 1 and determine a slewing condition, e.g., whether the voltage differential between the first input 101 of FIG. 1 and the second input 103 of FIG. 1 is positive, and, in some examples, exceeds a first voltage threshold. The differential voltage detector 220 includes a transistor 226, a transistor 228, a resistor 230, a resistor 232, a resistor 222, a resistor 224, and a voltage source VDD. In some examples, the voltage source VDD is included in the first control circuitry 204. In some examples, the voltage source VDD is an external source voltage (e.g., a voltage that is received by the first control circuitry 204). In some examples, the voltage source VDD is a positive supply voltage. In some examples, the transistor 226 includes a N-type transistor. In some examples, the transistor 228 includes a N-type transistor.

The gate of the transistor 226 is connected to the first input 101 of FIG. 1, the drain of the transistor 226 is connected to a first terminal of the resistor 222, and the source of the transistor 226 is connected to the sense amplifier 236. The gate of the transistor 228 is connected to the second input 103 of FIG. 1, the drain of the transistor 228 is connected to a first terminal of the resistor 224, and the source of the transistor 228 is connected to the sense amplifier 236. Also, the source of the transistor 226 is connected to a first terminal of the resistor 230, and the source of the transistor 228 is connected to a first terminal of the resistor 232. A second terminal of the resistor 230 is connected to a second terminal of the resistor 232. The transistor 226, the transistor 228, the resistor 230, and the resistor 232 are used for reading the differential voltage and to determine a slewing event. During a slewing event, imbalanced currents through the transistor 226 and the transistor 228 indicate an imbalance between the voltage drop across the resistor 230 and the resistor 232.

The sense amplifier 236 is configured to detect the voltage difference. The sense amplifier 236 includes a transistor 238, a transistor 240, a transistor 241, a current source 242, and a current source 244. In some examples, the transistor 238 is a P-type transistor. In some examples, the transistor 240 is a P-type transistor. In some examples, the transistor 241 is a P-type transistor. The source of the transistor 238 is connected to the source of transistor 228, the drain of the transistor 238 is connected to the current source 244, and the gate of the transistor 238 is connected to the gate of the transistor 240. Also, the drain of the transistor 238 is connected to the gate of the transistor 238. Also, the source of the transistor 238 is connected to the source of the transistor 241. The source of the transistor 240 is connected to the source of the transistor 226, the drain of the transistor 240 is connected to the current source 242, and the gate of the transistor 240 is connected to the gate of the transistor 238. Also, the drain of the transistor 240 is connected to the gate of the transistor 241. The source of the transistor 241 is connected to the source of the transistor 228, the drain of the transistor 241 is connected to a drain of a transistor 246, and the gate of the transistor 241 is connected to the drain of the transistor 240.

The first control circuitry 204 includes a current source 234. The current source 234 is connected to a node 231 disposed between the resistor 230 and the resistor 232. The current source 234 is also connected to a supply voltage VSS. The supply voltage VSS is connected to the current source 242 and the current source 244. The first control circuitry 204 includes a transistor 246. In some examples, the transistor 246 is an N-type transistor. The drain of the transistor 246 is connected to the drain of the transistor 241, the source of the transistor 246 is connected to the supply voltage VSS, and the gate of the transistor 246 is connected to the drain of the transistor 246 and the gates of transistor 248 and the transistor 250.

The inputs of the sense amplifier 236 are the sources of the transistor 240 and the transistor 238 and are connected to the sources of the transistor 226 and the transistor 228. The output of the sense amplifier 236 is the source of the transistor 241 and is connected to one of the inputs of the sense amplifier 236, so that a negative feedback loop is created. To assure the stability of the negative feedback loop, source inputs and source output are used.

The current generated through the transistor 241 is mirrored by the current mirror 251 and provided to the node 109 and the node 111 of FIG. 1. For example, the output of the current mirror 251 is the boost current that is provided to the node 109 and the node 111 of FIG. 1. The current mirror 251 includes a transistor 248 and a transistor 250. In some examples, transistor 248 is a N-type transistor. In some examples, the transistor 250 is a N-type transistor. The drain of the transistor 248 is connected to the node 109, the source of the transistor 248 is connected to the supply voltage VSS, and the gate of the transistor 248 is connected to the gates of the transistor 246 and the transistor 250, as well as the drain of the transistor 241. The drain of the transistor 250 is connected to the node 111 of FIG. 1, the source of the transistor 250 is connected to the supply voltage VSS, and the gate of the transistor 250 is connected to the gates of the transistor 246 and the transistor 248, as well as the drain of the transistor 241.

In some examples, the first control circuitry 204 may embed hysteresis at one or more locations in the first control circuitry 204. By embedding hysteresis in the first control circuitry 204, the first control circuitry 204 may be activated for controlled differential voltages (e.g., $V_{diff}$>100 mV). In some examples, the values for current source 242 and the current source 244 are different (e.g., mismatched) in order to create hysteresis. In some examples, hysteresis can be created by using different values for the transistor 238 and the transistor 240 or different values for the resistor 230 and the resistor 232. It is noted that the purpose of the hysteresis may be to activate the first control circuitry 204 in the event of relatively high differential voltage steps and to reduce the activation caused by noise or small signals.

Figure 3:
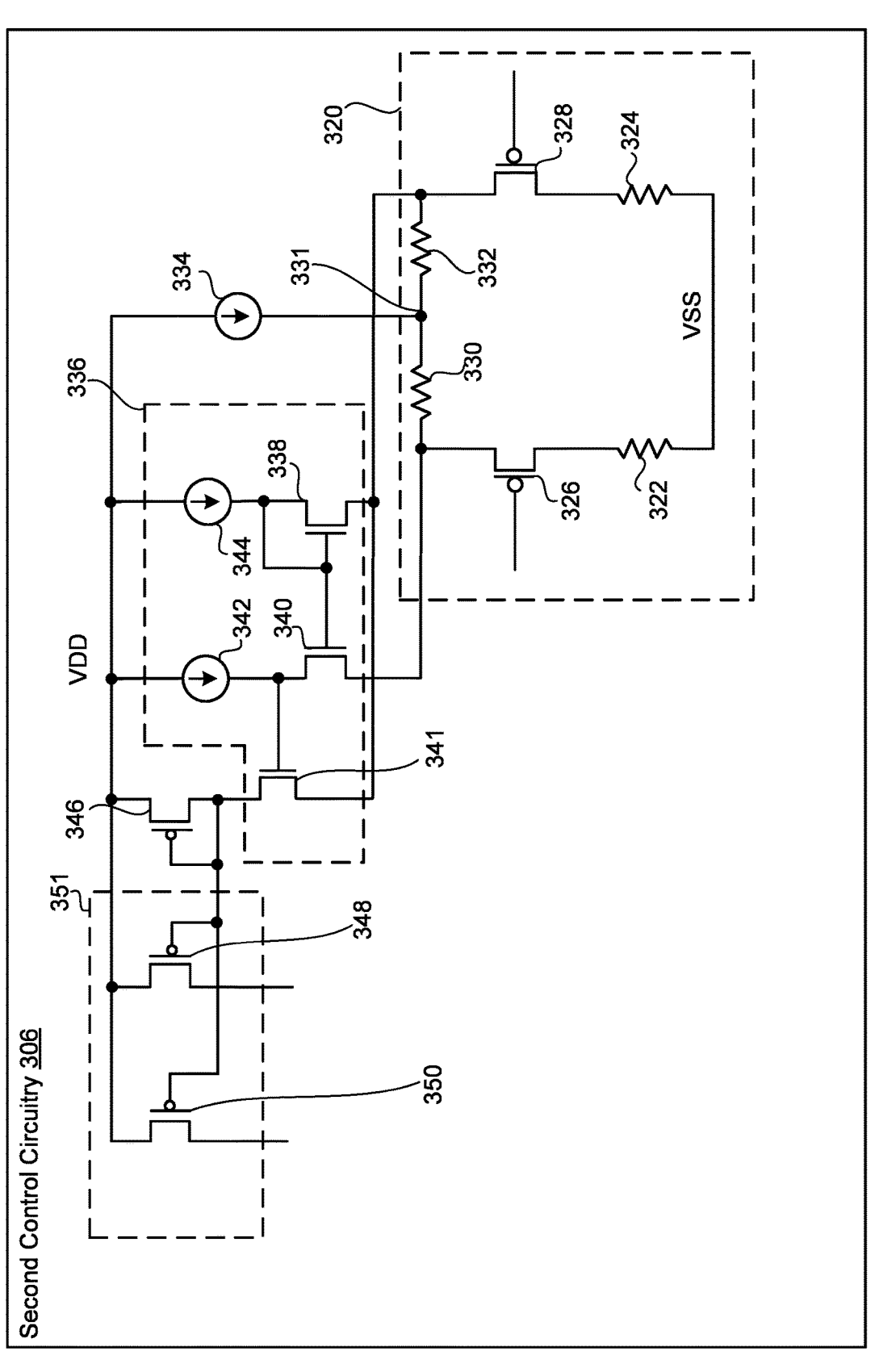
FIG. 3 illustrates a second control circuitry of the slew-rate boost circuitry according to an aspect.

FIG. 3 illustrates an example of a second control circuitry 306 according to an aspect. The second control circuitry 306 may be an example of the second control circuitry 106 of FIG. 1 and may include any of the details discussed with that figure.

The second control circuitry 306 includes a differential voltage detector 320, a sense amplifier 336, and a current mirror 351. The current mirror 351 is configured to generate the boost current, which is provided to the node 109 of FIG. 1 and the node 111 of FIG. 1.

The differential voltage detector 320 is configured to detect the voltage differential between the first input 101 of FIG. 1 and the second input 103 of FIG. 1 and determine a slewing condition, e.g., whether the voltage differential between the first input 101 of FIG. 1 and the second input 103 of FIG. 1 is negative and exceeds a threshold level. The differential voltage detector 220 includes a transistor 326, a transistor 328, a resistor 330, a resistor 332, a resistor 322, a resistor 324, and a voltage source VDD. In some examples, the transistor 326 includes a P-type transistor. In some examples, the transistor 328 includes a P-type transistor.

The gate of the transistor 326 is connected to the first input 101 of FIG. 1, the drain of the transistor 326 is connected to a first terminal of the resistor 322, and the source of the transistor 326 is connected to the sense amplifier 336. The gate of the transistor 328 is connected to the second input 103 of FIG. 1, the drain of the transistor 328 is connected to a first terminal of the resistor 324, and the source of the transistor 328 is connected to the sense amplifier 336. Also, the source of the transistor 326 is connected to a first terminal of the resistor 330, and the source of the transistor 326 is connected to a first terminal of the resistor 332. A second terminal of the resistor 330 is connected to a second terminal of the resistor 332. The transistor 326, the transistor 328, the resistor 330, and the resistor 332 are used for reading the differential voltage and to determine a slewing event. During a slewing event, imbalanced currents through the transistor 326 and the transistor 328 indicate an imbalance between the voltage drop across the resistor 330 and the resistor 332.

The sense amplifier 336 is configured to detect the voltage difference. The sense amplifier 336 includes a transistor 338, a transistor 340, a transistor 341, a current source 342, and a current source 344. In some examples, the transistor 338 is a N-type transistor. In some examples, the transistor 340 is a N-type transistor. In some examples, the transistor 341 is a N-type transistor. The source of the transistor 338 is connected to the source of transistor 328, the drain of the transistor 338 is connected to the current source 344, and the gate of the transistor 338 is connected to the gate of the transistor 340. Also, the drain of the transistor 338 is connected to the gate of the transistor 338. Also, the source of the transistor 338 is connected to the source of the transistor 341. The source of the transistor 340 is connected to the source of the transistor 326, the drain of the transistor 340 is connected to the current source 342, and the gate of the transistor 340 is connected to the gate of the transistor 338. Also, the drain of the transistor 340 is connected to the gate of the transistor 341. The source of the transistor 341 is connected to the source of the transistor 328, the drain of the transistor 341 is connected to a drain of a transistor 346, and the gate of the transistor 341 is connected to the drain of the transistor 340.

The second control circuitry 306 includes a current source 334. The current source 334 is connected to a node 331 disposed between the resistor 330 and the resistor 332. The current source 334 is also connected to a supply voltage VSS. The supply voltage VSS is connected to the current source 342 and the current source 344. The second control circuitry 306 includes a transistor 346. In some examples, the transistor 346 is a P-type transistor. The drain of the transistor 346 is connected to the drain of the transistor 341, the source of the transistor 346 is connected to the supply voltage VDD, and the gate of the transistor 346 is connected to the drain of the transistor 346 and the gates of transistor 348 and the transistor 350.

The inputs of the sense amplifier 336 are the sources of the transistor 340 and the transistor 338 and are connected to the sources of the transistor 326 and the transistor 328. The output of the sense amplifier 336 is the source of the transistor 341 and is connected to one of the inputs of the sense amplifier 336, so that a negative feedback loop is created. To assure the stability of the negative feedback loop, source inputs and source output are used.

The current generated through the transistor 341 is mirrored by the current mirror 351 and provided to the node 109 and the node 111 of FIG. 1. For example, the output of the current mirror 351 is the boost current that is provided to the node 109 and the node 111 of FIG. 1. The current mirror 351 includes a transistor 348 and a transistor 350. In some examples, transistor 348 is a P-type transistor. In some examples, the transistor 350 is a P-type transistor. The drain of the transistor 348 is connected to the node 109, the source of the transistor 348 is connected to the supply voltage VSS, and the gate of the transistor 348 is connected to the gates of the transistor 346 and the transistor 350, as well as the drain of the transistor 341. The drain of the transistor 350 is connected to the node 111 of FIG. 1, the source of the transistor 350 is connected to the supply voltage VSS, and the gate of the transistor 350 is connected to the gates of the transistor 346 and the transistor 348, as well as the drain of the transistor 341.

In some examples, the second control circuitry 306 may embed hysteresis at one or more locations in the second control circuitry 306. By embedding hysteresis in the second control circuitry 306, the second control circuitry 306 may be activated for controlled differential voltages (e.g., $V_{diff} > 100$ mV). In some examples, the values for current source 342 and the current source 344 are different (e.g., mismatched) in order to create hysteresis. In some examples, hysteresis can be created by using different values for the transistor 338 and the transistor 340 or different values for the resistor 330 and the resistor 332. It is noted that the purpose of the hysteresis may be to activate the second control circuitry 306 in the event of relatively high differential voltage steps and to reduce the activation caused by noise or small signals.

Figure 4:
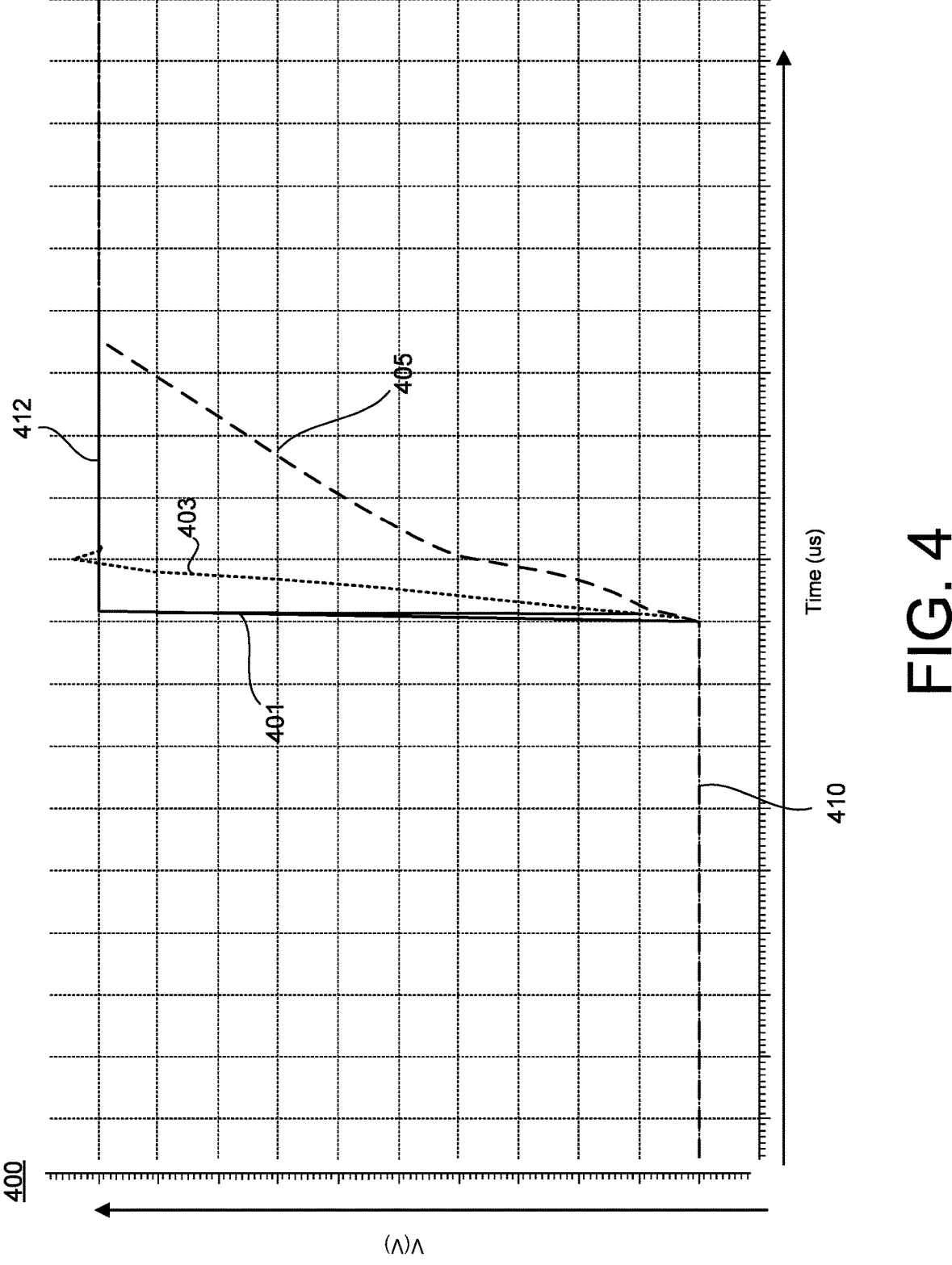
FIG. 4 illustrates a slew rate of a positive voltage slope according to an aspect.

FIG. 4 illustrates a graph 400 depicting a transient response of an operational amplifier with the slew-rate boost circuitry discussed herein and a transient response of an operational amplifier without the slew-rate boost circuitry. The graph 400 depicts voltage on the y-axis and time on the x-axis. Line 401 depicts an input voltage that is provided to the operational amplifier. As shown in FIG. 4, the input voltage has a step voltage that increases from a first voltage level 410 to a second voltage level 412. Line 403 depicts the output voltage of the operational amplifier with the slew rate boost circuitry. The line 403 depicts the positive voltage slope of the output voltage during the transient response. Line 405 depicts the output voltage of the operational amplifier without the slew rate boost circuitry. As shown in FIG. 4, the slew rate is increased as compared to the operational amplifier without the slew rate boost circuitry.

Figure 5:
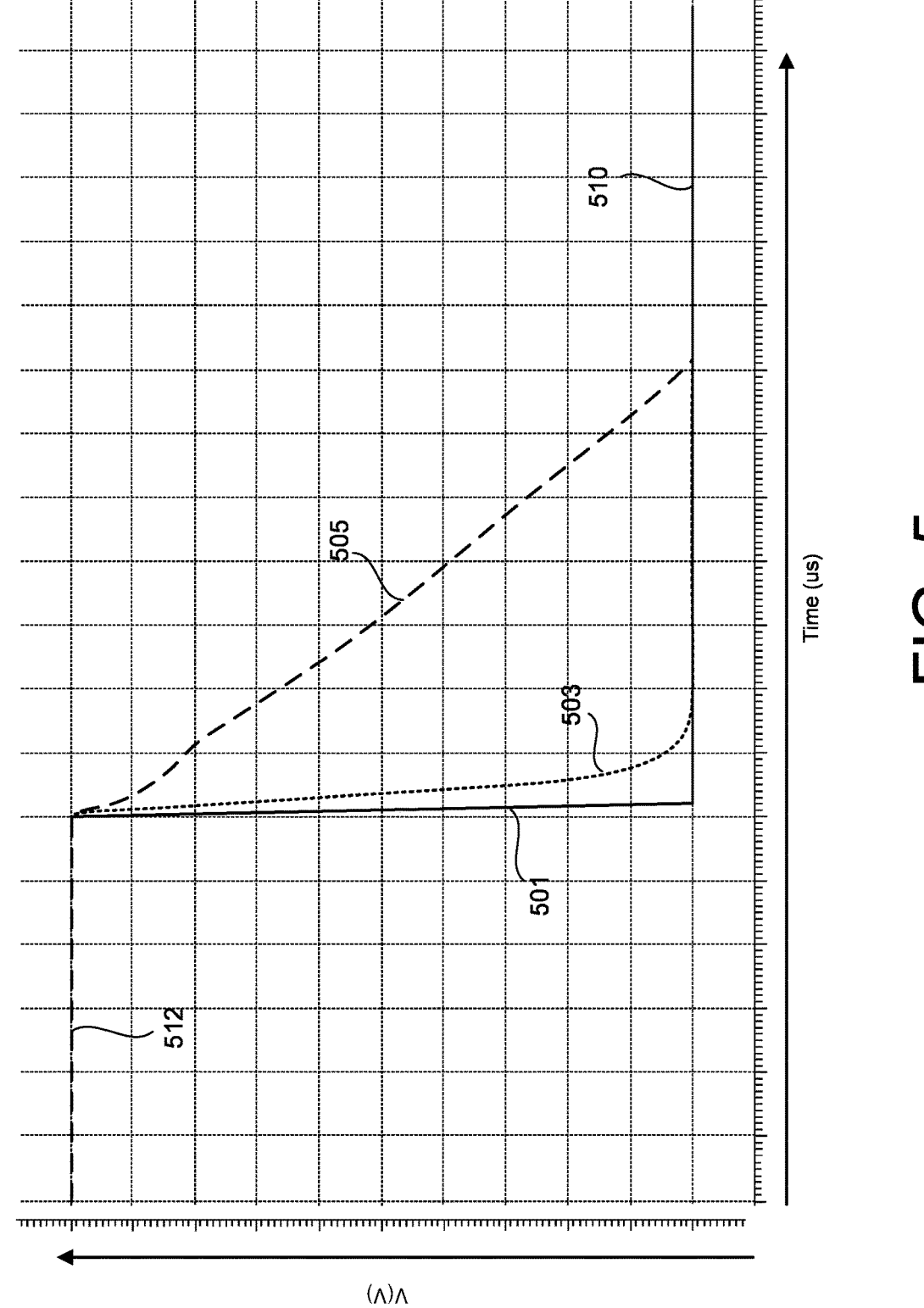
FIG. 5 illustrates a slew rate of a negative voltage slope according to an aspect.

FIG. 5 illustrates a graph 500 depicting a transient response of an operational amplifier with the slew-rate boost circuitry discussed herein and a transient response of an operational amplifier without the slew-rate boost circuitry. The graph 500 depicts voltage on the y-axis and time on the x-axis. Line 501 depicts an input voltage that is provided to the operational amplifier. As shown in FIG. 5, the input voltage has a step voltage that decreases from a second voltage level 512 to a first voltage level 510. Line 503 depicts the output voltage of the operational amplifier with the slew rate boost circuitry. The line 503 depicts the negative voltage slope of the output voltage during the transient response. Line 505 depicts the output voltage of the operational amplifier without the slew rate boost circuitry. As shown in FIG. 5, the slew rate is increased as compared to the operational amplifier without the slew rate boost circuitry.

Figures 6A, 6B, 6C:
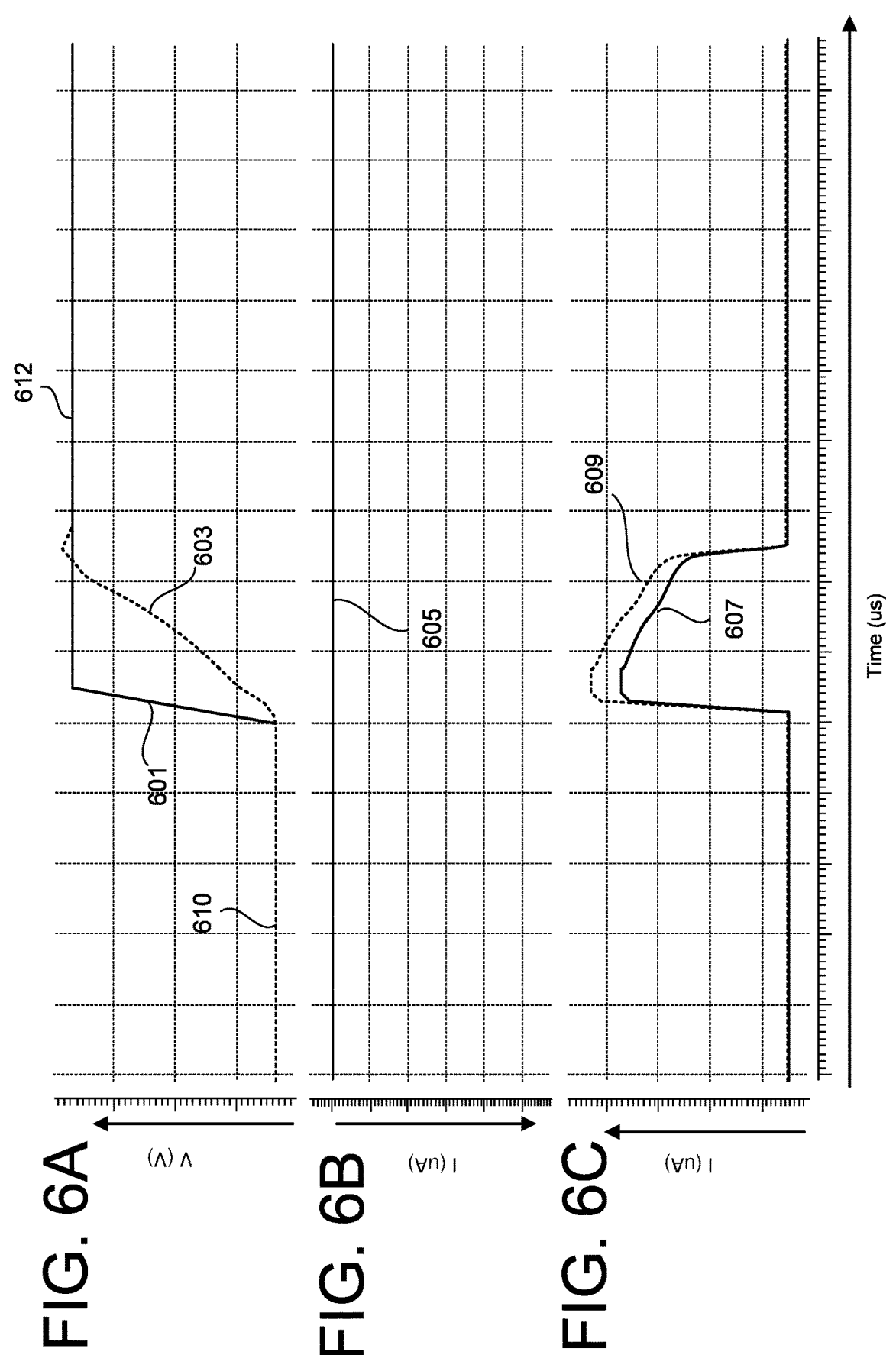
FIGS. 6A through 6C illustrate graphs depicting voltage and boost current over time according to an aspect.

FIGS. 6A through 6C illustrate various graphs depicting a positive voltage slope and currents provided by the slew-rate boost circuitry according to an aspect. The graph of FIG. 6A depicts voltage level on the y-axis and time on the x-axis. Line 601 depicts an input voltage that is provided to the operational amplifier. As shown in FIG. 6A, the input voltage has a step voltage that increases from a first voltage level 610 to a second voltage level 612. Line 603 depicts the output voltage of the operational amplifier with the slew rate boost circuitry. The line 603 depicts the positive voltage slope of the output voltage during the transient response. The graph of FIG. 6B and the graph of FIG. 6C depicts the current level on the y-axis and time on the x-axis. In FIG. 6B, line 605 depicts the boost current provided by the second control circuitry 106 of FIG. 1. For the rising edge, since the second control circuitry 106 is not activated, the boost current provided by the second control circuitry 106 is zero or close to zero. In FIG. 6C, lines 607 and 609 depict the boost currents provided by the first control circuitry 104 of FIG. 1. In some examples, the boost currents are from the first control circuitry (e.g., 104, 204)—one for each capacitor in FIG. 1 (e.g., capacitors 112, 114). In some examples, the lines 609 and 607 represent the drain currents of transistor 250 and transistor 248 of FIG. 2, respectively.

Figures 7A, 7B, 7C:
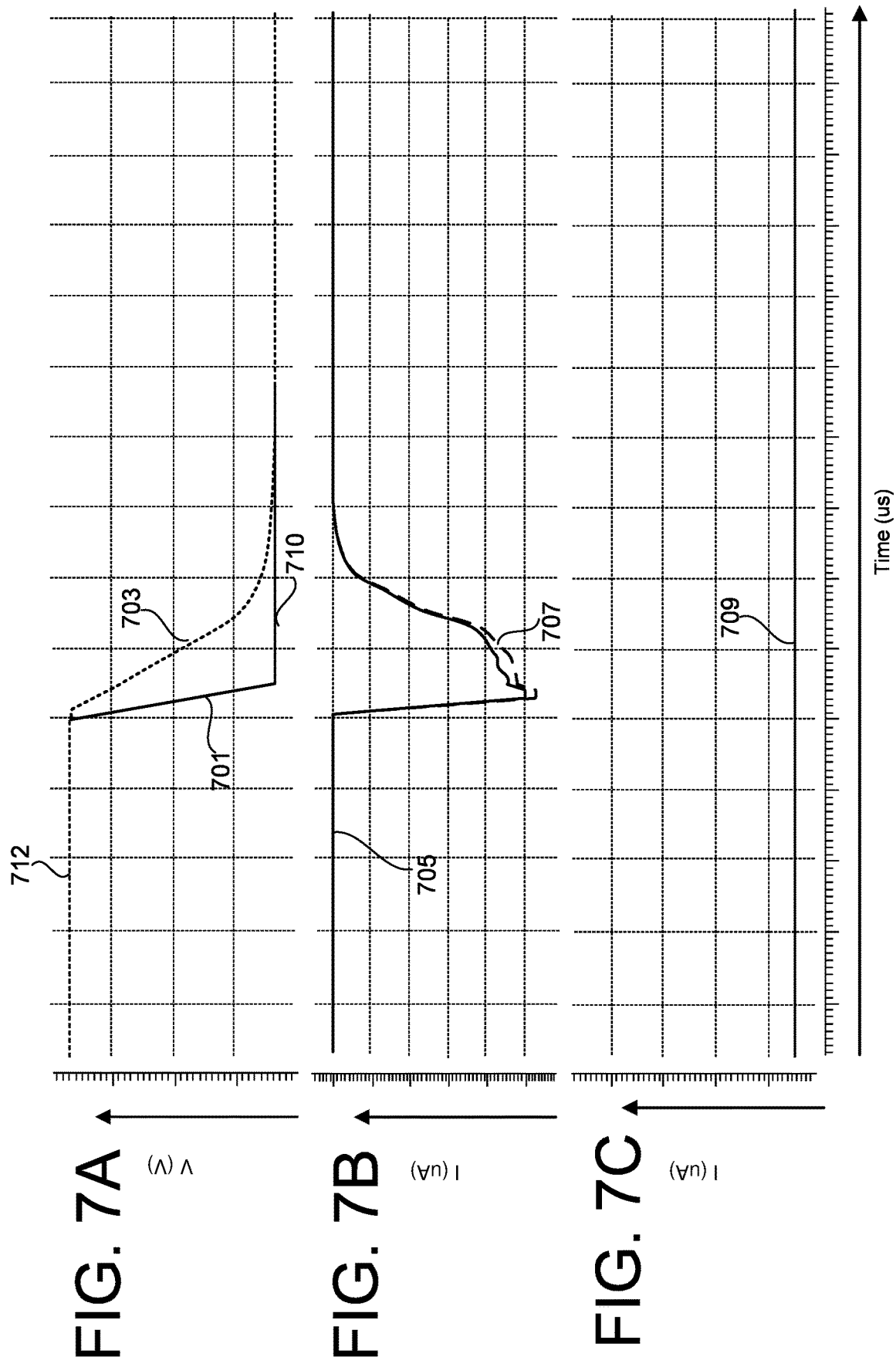
FIGS. 7A through 7C illustrate graphs depicting voltage and boost current over time according to another aspect.

FIGS. 7A through 7C illustrate various graphs depicting a positive voltage slope and currents provided by the slew-rate boost circuitry according to an aspect. The graph of FIG. 7A depicts voltage level on the y-axis and time on the x-axis. Line 701 depicts an input voltage that is provided to the operational amplifier. As shown in FIG. 7A, the input voltage has a step voltage that decreases from a second voltage level 712 to a first voltage level 710. Line 703 depicts the output voltage of the operational amplifier with the slew rate boost circuitry. The line 703 depicts the negative voltage slope of the output voltage during the transient response. The graph of FIG. 7B and the graph of FIG. 7C depicts the current level on the y-axis and time on the x-axis. In FIG. 7B, lines 707 and 705 depict the boost currents provided by the second control circuitry 106 of FIG. 1. In some examples, the boost currents are from the second control circuitry (e.g., 106, 206)—one for each capacitor in FIG. 1 (e.g., capacitors 112, 114). In some examples, the lines 705 and 707 represent the drain currents of transistor 350 and transistor 348 of FIG. 3, respectively. In FIG. 7C, line 709 depicts the boost current provided by the first control circuitry 104 of FIG. 1. For the falling edge, since the first control circuitry 104 is not activated, the boost current provided by the first control circuitry 104 is zero or close to zero.

Figures 8A, 8B:
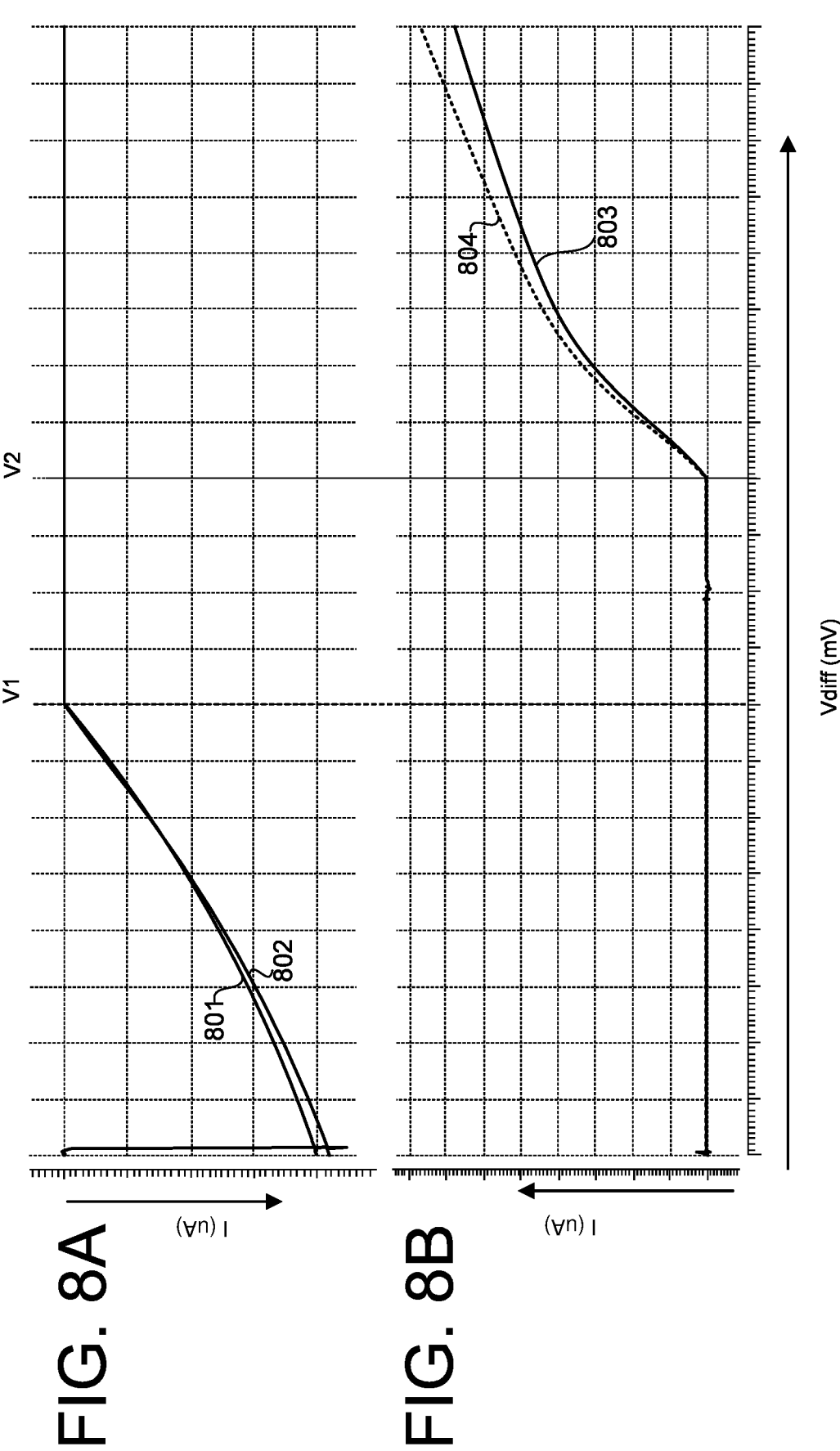
FIGS. 8A and 8B illustrate graphs depicting boost current over increasing values of voltage differential according to an aspect.

FIGS. 8A and 8B illustrate graphs depicting boost currents over increasing values of the voltage differential ($V_{diff}$) according to an aspect. The voltage differential is the voltage difference between the first input 101 of FIG. 1 and the second input 103 of FIG. 1. In FIG. 8A, lines 801 and 802 depict the boost currents provided by the second control circuitry 106 of FIG. 1 (and supplied to the capacitors 112, 114 of FIG. 1). As shown in FIG. 8A, the boost current (e.g., a negative current) increases when a voltage differential is detected and the boost current decreases until the voltage differential reaches a first voltage threshold (V1) at which the boost current is zero or substantially zero. As the voltage differential continues to increase to a second voltage threshold (V2), the boost current provided by the second control circuitry 106 continues to remain at zero or substantially zero. In FIG. 8B, lines 803 and 804 depict the boost currents provided by the first control circuitry 104 of FIG. 1 (and supplied to the capacitors 112, 114 of FIG. 1). As shown in FIG. 8B, when the voltage differential reaches the second voltage threshold (V2), the boost current increases.

FIG. 9 illustrates a flowchart 900 depicting example operations of an operational amplifier with a slew-rate boost circuitry according to an aspect. Although the flowchart 900 is explained with reference to the circuit 100 of FIG. 1, the operations may be implemented by any of the examples discussed herein. Although the flowchart 900 of FIG. 9 illustrates the operations in sequential order, it will be appreciated that this is merely an example, and that additional or alternative operations may be included. Further, operations of FIG. 9 and related operations may be executed in a different order than that shown, or in a parallel or overlapping fashion.

Operation 902 includes detecting a first voltage differential between a first input 101 of a differential amplifier 108 and a second input 103 of the differential amplifier 108. In some examples, the first voltage differential is a voltage difference between the first input 101 and the second input 103 that exceeds a first voltage threshold. Operation 904 includes applying, at an output of the differential amplifier 108, a first boost current to charge a capacitor (e.g., capacitor 112 and/or capacitor 114) during a first period of time in which an output voltage 116 increases from a first voltage level to a second voltage level. In some examples, the first boost current is applied at the input of the output stage 110. In some examples, operation 902 and operation 904 are executed by the first control circuitry 104. In some examples, the first boost current is added to the existing current to increase the slew-rate (e.g., the positive voltage slope). In some examples, operation 904 is executed only during a transient response of the operational amplifier 105.

Operation 906 includes detecting a second voltage differential between the first input 101 and the second input 103. In some examples, the second voltage differential is a voltage difference between the first input 101 and the second input 103 that exceeds a second voltage threshold. Operation 908 includes applying, at the output of the differential amplifier 108, a second boost current to charge the capacitor (e.g., capacitor 112 and/or capacitor 114) during a second period of time in which the output voltage 116 decreases from the second voltage level to the first voltage level. In some examples, the second boost current is applied at the input of the output stage 110. In some examples, operation 902 and operation 904 are executed by the second control circuitry 106. In some examples, the second boost current is added to the existing current to increase the slew-rate (e.g., the negative voltage slope). In some examples, operation 908 is executed only during a transient response of the operational amplifier 105.

In some examples, the operations include removing the first boost current in response to expiration of the first period of time. In some examples, the removal of the first boost current may include controlling the first boost current to have a value of zero or substantially zero. The operations may include removing the second boost current in response to expiration of the second period of time. In some examples, the removal of the first boost current may include controlling the first boost current to have a value of zero or substantially zero. In some examples, the first boost current is not applied during the second period of time, and the second boost current is not applied during the first period of time.

The slew-rate boost circuitry is configured to, in response to the output voltage achieving the target voltage level, remove the boost current. The slew-rate boost circuitry is connected to the first input and the second input. The differential amplifier includes a first output and a second output, the first output being connected to the output stage, the second output being connected to the output stage, the slew-rate boost circuitry being connected to the first output and the second output. The slew-rate boost circuitry includes a current mirror, where the current mirror includes a first transistor and a second transistor. The first transistor is connected to the first output and the second transistor is connected to the second output. The slew-rate boost circuitry includes a differential voltage detector configured to detect the voltage differential. The capacitor is connected in parallel with the output stage. The boost current is a first boost current. The slew-rate boost circuitry includes a first control circuitry configured to detect that the voltage differential between the first input and the second input exceeds a first voltage threshold, and apply, at the output of the differential amplifier, the first boost current to charge the capacitor during a first period of time in which the output voltage increases from a first voltage level to a second voltage level. The slew-rate boost circuitry includes a second control circuitry configured to detect that the voltage differential between the first input and the second input exceeds a second voltage threshold, and apply, at the output of the differential amplifier, a second boost current to charge the capacitor during a second period of time in which the output voltage decreases from the second voltage level to the first voltage level.

The differential amplifier includes a first input and a second input, where the first control circuitry configured to detect a first voltage differential between the first input and the second input, where, in response to the first voltage differential being detected, the first control circuitry is configured to apply the first boost current. The second control circuitry is configured to detect a second voltage differential between the first input and the second input, wherein, in response to the second voltage differential being detected, the second control circuitry is configured to apply the second boost current. The first boost current is not applied during the second period of time, and the second boost current is not applied during the first period of time. The differential amplifier includes a first input and a second input, where the first control circuitry is connected to the first input and the second input, the second control circuitry being connected to the first input and the second input. The differential amplifier includes a first output and a second output, the first output being connected to the output stage, the second output being connected to the output stage, the first control circuitry being connected to the first output and the second output, the second control circuitry being connected to the first output and the second output. Each of the first control circuitry and the second control circuitry includes a current mirror, the current mirror including a first transistor and a second transistor, the first transistor being connected to the first output, the second transistor being connected to the second output. The first control circuitry includes a first differential voltage detector configured to detect the first voltage differential, the second control circuitry including a second differential voltage detector configured to detect the second voltage differential.

The method may include removing the first boost current in response to expiration of the first period of time and removing the second boost current in response to expiration of the second period of time. The first boost current is not applied during the second period of time, and the second boost current is not applied during the first period of time.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. Various implementations of the systems and techniques described here can be realized as and/or generally be referred to herein as a circuit, a module, a block, or a system that can combine software and hardware aspects. For example, a module may include the functions/acts/computer program instructions executing on a processor (e.g., a processor formed on a silicon substrate, a GaAs substrate, and the like) or some other programmable data processing apparatus.

Some of the above examples are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed but may also have additional steps not included in the figure. The processes may correspond to methods, functions, procedures, subroutines, subprograms, etc.

Methods discussed above, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of examples discussed herein. As used herein, the term and/or includes any and all combinations of one or more of the associated listed items.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the above example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative embodiments, reference to acts and symbolic representations of operations (e.g., in the form of flowcharts) that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as processing or computing or calculating or determining of displaying or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Lastly, it should also be noted that whilst the accompanying claims set out particular combinations of features described herein, the scope of the present disclosure is not limited to the particular combinations hereafter claimed, but instead extends to encompass any combination of features or embodiments herein disclosed irrespective of whether or not that particular combination has been specifically enumerated in the accompanying claims at this time.

What is claimed is:

1. A circuit comprising:
an operational amplifier including a differential amplifier, a capacitor, and an output stage, the output stage configured to generate an output voltage; and
a slew-rate boost circuitry connected to the operational amplifier and including a first boost transistor connected to a first output of the differential amplifier and a second boost transistor connected to a second output of the differential amplifier, the slew-rate boost circuitry is configured to:
detect a voltage differential between a first input of the differential amplifier and a second input of the differential amplifier; and
apply, at an output of the differential amplifier, a boost current to charge the capacitor during a period of time in which the output voltage changes from a first voltage level to a second voltage level, the boost current being generated by the first boost transistor and the second boost transistor.

2. The circuit of claim 1, wherein the slew-rate boost circuitry is configured to:
in response to the output voltage achieving the second voltage level, remove the boost current.

3. The circuit of claim 1, wherein the slew-rate boost circuitry is connected to the first input of the differential amplifier and the second input of the differential amplifier.

4. The circuit of claim 1, wherein, the first output of the differential amplifier is connected to the output stage, the second output of the differential amplifier is connected to the output stage.

5. The circuit of claim 1, wherein a gate of the first boost transistor is connected to a gate of the second boost transistor.

6. The circuit of claim 1, wherein the slew-rate boost circuitry includes a differential voltage detector configured to detect the voltage differential.

7. The circuit of claim 1, wherein the capacitor is connected in parallel with the output stage.

8. The circuit of claim 1, wherein the boost current is a first boost current, the slew-rate boost circuitry including a first control circuitry configured to:
detect that the voltage differential between the first input and the second input exceeds a first voltage threshold; and
apply, at the output of the differential amplifier, the first boost current to charge the capacitor during a first period of time in which the output voltage increases from the first voltage level to the second voltage level.

9. The circuit of claim 8, wherein the slew-rate boost circuitry includes a second control circuitry configured to:
detect that the voltage differential between the first input and the second input exceeds a second voltage threshold; and
apply, at the output of the differential amplifier, a second boost current to charge the capacitor during a second period of time in which the output voltage decreases from the second voltage level to the first voltage level.

10. A circuit comprising:
an operational amplifier including a differential amplifier, a capacitor, and an output stage, the output stage configured to generate an output voltage;
a first control circuitry including a first boost transistor connected to a first output of the differential amplifier and a second boost transistor connected to a second output of the differential amplifier, the first control circuitry configured to:
apply, at an output of the differential amplifier, a first boost current to charge the capacitor during a first period of time in which the output voltage changes from a first voltage level to a second voltage level, the first boost current being generated by the first boost transistor and the second boost transistor; and
a second control circuitry configured to apply, at the output of the differential amplifier, a second boost current to charge the capacitor during a second period of time in which the output voltage changes from the second voltage level to the first voltage level.

11. The circuit of claim 10, wherein the differential amplifier includes a first input and a second input, the first control circuitry configured to detect a first voltage differential between the first input and the second input, wherein, in response to the first voltage differential being detected, the first control circuitry is configured to apply the first boost current.

12. The circuit of claim 11, wherein the second control circuitry is configured to detect a second voltage differential between the first input and the second input, wherein, in response to the second voltage differential being detected, the second control circuitry is configured to apply the second boost current.

13. The circuit of claim 10, wherein the first boost current is not applied during the second period of time, and the second boost current is not applied during the first period of time.

14. The circuit of claim 10, wherein the differential amplifier includes a first input and a second input, the first control circuitry being connected to the first input and the second input, the second control circuitry being connected to the first input and the second input.

15. The circuit of claim 10, wherein the first output of the differential amplifier is connected to the output stage, the second output of the differential amplifier being connected to the output stage, the first control circuitry being connected to the first output and the second output, the second control circuitry being connected to the first output and the second output.

16. The circuit of claim 12, wherein the first control circuitry includes a first differential voltage detector configured to detect the first voltage differential, the second control circuitry including a second differential voltage detector configured to detect the second voltage differential.

17. A method for increasing a slew-rate of an operational amplifier, the method comprising:

detecting a first voltage differential between a first input of a differential amplifier and a second input of the differential amplifier;

generating a first boost current using a first boost transistor and a second boost transistor, the first boost transistor being connected to a first output of the differential amplifier, the second boost transistor being connected to a second output of the differential amplifier;

applying, at an output of the differential amplifier, the first boost current to charge a capacitor during a first period of time in which an output voltage changes from a first voltage level to a second voltage level;

detecting a second voltage differential between the first input and the second input; and applying, at the output of the differential amplifier, a second boost current to charge the capacitor during a second period of time in which the output voltage changes from the second voltage level to the first voltage level.

18. The method of claim 17, further comprising:

removing the first boost current in response to expiration of the first period of time; and removing the second boost current in response to the output voltage achieving the first voltage level.

19. The method of claim 17, wherein the first boost current is not applied during the second period of time, and the second boost current is not applied during the first period of time.

20. The circuit of claim 1, wherein the capacitor is connected between an input of the output stage and an output of the output stage.

* * * * *